United States Patent
Walker

(10) Patent No.: US 9,928,925 B1
(45) Date of Patent: Mar. 27, 2018

(54) MULTI-CHIP NON-VOLATILE SEMICONDUCTOR MEMORY PACKAGE INCLUDING HEATER AND SENSOR ELEMENTS

(71) Applicant: Darryl G. Walker, San Jose, CA (US)

(72) Inventor: Darryl G. Walker, San Jose, CA (US)

( * ) Notice: Subject to any disclaimer, the term of this patent is extended or adjusted under 35 U.S.C. 154(b) by 0 days.

(21) Appl. No.: 14/639,313

(22) Filed: Mar. 5, 2015

Related U.S. Application Data

(60) Provisional application No. 62/117,037, filed on Feb. 17, 2015.

(51) Int. Cl.
| | |
|---|---|
| G11C 16/04 | (2006.01) |
| G11C 16/28 | (2006.01) |
| G11C 29/00 | (2006.01) |
| H05B 3/14 | (2006.01) |
| G11C 16/06 | (2006.01) |
| H01L 25/065 | (2006.01) |
| H01L 23/34 | (2006.01) |
| H01L 23/36 | (2006.01) |
| H01L 23/522 | (2006.01) |

(52) U.S. Cl.
CPC ............. *G11C 29/70* (2013.01); *G11C 16/04* (2013.01); *G11C 16/06* (2013.01); *H01L 23/34* (2013.01); *H01L 23/345* (2013.01); *H01L 23/36* (2013.01); *H01L 23/5226* (2013.01); *H01L 25/0657* (2013.01); *H05B 3/146* (2013.01); *H05B 3/148* (2013.01); *H01L 2225/06541* (2013.01); *H01L 2225/06589* (2013.01)

(58) Field of Classification Search
CPC ............................ G11C 29/70; H01L 25/0657
USPC ...................................................... 365/185.09
See application file for complete search history.

(56) References Cited

U.S. PATENT DOCUMENTS

| 3,450,867 A | 6/1969 | Blum et al. |
| 3,459,925 A | 8/1969 | Goosey et al. |
| 3,573,776 A | 4/1971 | Dick et al. |
| 3,903,395 A | 9/1975 | Hamstra |

(Continued)

FOREIGN PATENT DOCUMENTS

| WO | WO-95/25296 | 9/1995 |
| WO | WO-03/077091 | 9/2003 |

OTHER PUBLICATIONS

"Measured Thermal Resistance of Microbumps in 3D Chip Stacks", Evan Colgan, Jamil Wakil, IBM, Electronics Cooling publication from http://www.electronics-cooling.com , Mar. 13, 2013. Document attached as npl.*

(Continued)

*Primary Examiner* — Anthan Tran
*Assistant Examiner* — Mushfique Siddique

(57) ABSTRACT

A method of healing a plurality of non-volatile semiconductor memory devices on a multi-chip package is disclosed. The multi-chip package can be heated to a temperature range having a temperature range upper limit value and a temperature range lower limit value. The temperature of the multi-chip package can be kept essentially within the temperature range for a predetermined time period by monitoring a thermal sensing element with a sensing circuit outside of the multi-chip package. The thermal sensing element may be located near the components with the lowest failure temperature to ensure the multi-chip package is not damaged during the healing process.

16 Claims, 9 Drawing Sheets

(56) References Cited

U.S. PATENT DOCUMENTS

| | | | |
|---|---|---|---|
| 4,493,981 A | 1/1985 | Payne | |
| 4,502,043 A | 2/1985 | Moore | |
| 4,564,748 A | 1/1986 | Gupton | |
| 4,833,406 A | 5/1989 | Foster | |
| 5,111,691 A | 5/1992 | John et al. | |
| 5,278,796 A | 1/1994 | Tillinghast et al. | |
| 5,303,160 A | 4/1994 | Winter et al. | |
| 5,742,177 A | 4/1998 | Kalb, Jr. | |
| 5,774,425 A | 6/1998 | Ivanov et al. | |
| 5,798,663 A | 8/1998 | Fugere et al. | |
| 5,831,333 A * | 11/1998 | Malladi | H01L 23/34 165/80.2 |
| 5,841,204 A | 11/1998 | English | |
| 5,873,053 A | 2/1999 | Pricer et al. | |
| 5,875,142 A | 2/1999 | Chevallier | |
| 5,875,312 A | 2/1999 | Walsh et al. | |
| 5,931,011 A | 8/1999 | Shima et al. | |
| 5,956,289 A | 9/1999 | Norman et al. | |
| 6,002,627 A | 12/1999 | Chevallier | |
| 6,091,255 A * | 7/2000 | Godfrey | G06F 1/206 324/750.06 |
| 6,140,860 A * | 10/2000 | Sandhu | G05F 3/245 327/513 |
| 6,150,872 A | 11/2000 | McNeill et al. | |
| 6,160,755 A | 12/2000 | Norman et al. | |
| 6,281,573 B1 * | 8/2001 | Atwood | H01L 23/3675 165/80.3 |
| 6,363,490 B1 | 3/2002 | Senyk | |
| 6,438,057 B1 | 8/2002 | Ruckerbauer | |
| 6,442,500 B1 | 8/2002 | Kim | |
| 6,549,065 B2 | 4/2003 | Opris | |
| 6,567,763 B1 | 5/2003 | Javanifard et al. | |
| 6,674,623 B1 | 1/2004 | Abe et al. | |
| 6,678,185 B1 | 1/2004 | Cleary | |
| 6,717,530 B1 * | 4/2004 | Schmidt | G06F 1/206 257/E23.08 |
| 6,847,911 B2 * | 1/2005 | Huckaby | G01K 7/425 374/E7.043 |
| 6,937,087 B2 | 8/2005 | Sim et al. | |
| 6,975,047 B2 * | 12/2005 | Pippin | G06F 1/206 307/117 |
| 6,980,918 B2 * | 12/2005 | Gunther | G01K 7/015 374/E7.036 |
| 6,985,000 B2 * | 1/2006 | Feder | G01R 31/2874 324/750.05 |
| 7,035,157 B2 | 4/2006 | Chang | |
| 7,038,967 B2 | 5/2006 | Uchikoba et al. | |
| 7,078,955 B2 | 7/2006 | Kim et al. | |
| 7,102,417 B2 | 9/2006 | Gordon et al. | |
| 7,106,127 B2 | 9/2006 | Sim et al. | |
| 7,107,178 B2 | 9/2006 | Won et al. | |
| 7,158,911 B2 | 1/2007 | Gunther et al. | |
| 7,173,844 B2 | 2/2007 | Lee et al. | |
| 7,177,218 B2 | 2/2007 | Choi et al. | |
| 7,184,313 B2 | 2/2007 | Betser et al. | |
| 7,193,917 B2 | 3/2007 | Takahashi et al. | |
| 7,216,064 B1 | 5/2007 | Pippin | |
| 7,248,527 B2 | 7/2007 | Park | |
| 7,292,488 B2 | 11/2007 | Hokenmaier et al. | |
| 7,310,013 B2 | 12/2007 | Porter | |
| 7,315,792 B2 | 1/2008 | Min et al. | |
| 7,376,532 B2 | 5/2008 | Johns et al. | |
| 7,383,149 B1 | 6/2008 | Walker | |
| 7,423,473 B2 | 9/2008 | Kim | |
| 7,460,394 B2 * | 12/2008 | Happ | G11C 11/40626 365/113 |
| 7,480,588 B1 * | 1/2009 | Walker | G01K 7/425 702/132 |
| 7,483,270 B2 * | 1/2009 | Blake | F04D 27/004 361/679.48 |
| 7,492,657 B2 | 2/2009 | Sako | |
| 7,532,056 B2 | 5/2009 | Seo | |
| 7,535,786 B1 | 5/2009 | Walker | |
| 7,553,077 B2 | 6/2009 | Schubring et al. | |
| 7,554,869 B2 | 6/2009 | Kim et al. | |
| 7,581,881 B2 | 9/2009 | Kim et al. | |
| 7,583,553 B2 | 9/2009 | Mori | |
| 7,592,820 B2 | 9/2009 | Laakso et al. | |
| 7,603,249 B1 | 10/2009 | Walker | |
| 7,630,266 B2 | 12/2009 | Incarnati et al. | |
| 7,654,736 B1 | 2/2010 | Walker | |
| 7,760,570 B1 | 7/2010 | Walker | |
| 7,814,350 B2 | 10/2010 | Gaskins et al. | |
| 7,953,573 B2 | 5/2011 | Walker | |
| 7,990,776 B2 | 8/2011 | Kim et al. | |
| 8,005,641 B2 | 8/2011 | Walker | |
| 8,040,742 B2 | 10/2011 | Walker | |
| 8,049,145 B1 | 11/2011 | Walker | |
| 8,061,895 B2 | 11/2011 | Tsukude | |
| 8,081,532 B2 | 12/2011 | Walker | |
| 8,192,082 B2 * | 6/2012 | Song | G01K 3/005 374/170 |
| 8,193,573 B2 | 6/2012 | Bronner et al. | |
| 8,272,781 B2 | 9/2012 | Nale | |
| 8,308,359 B2 | 11/2012 | Walker | |
| 8,341,335 B2 | 12/2012 | Weingarten et al. | |
| 8,344,475 B2 * | 1/2013 | Shaeffer | G11C 13/0002 257/528 |
| 8,497,453 B2 | 7/2013 | Walker | |
| 8,988,115 B2 | 3/2015 | Kim et al. | |
| 9,202,572 B2 | 12/2015 | Bronner et al. | |
| 9,286,991 B1 * | 3/2016 | Walker | G11C 7/04 |
| 2003/0234630 A1 * | 12/2003 | Blake | F04D 27/004 318/471 |
| 2004/0083075 A1 * | 4/2004 | Fan | G01K 7/01 702/129 |
| 2007/0030019 A1 * | 2/2007 | Kinsley | G01R 31/2851 324/750.07 |
| 2007/0145578 A1 * | 6/2007 | Lee | G11C 5/02 257/723 |
| 2008/0018482 A1 | 1/2008 | Chiu et al. | |
| 2010/0230807 A1 * | 9/2010 | Bronner | G11C 16/3418 257/734 |
| 2011/0110158 A1 | 5/2011 | Schuette | |
| 2013/0162282 A1 * | 6/2013 | Hatakeyama | H01L 22/30 324/762.01 |
| 2013/0187157 A1 * | 7/2013 | Kim | H01L 23/345 257/48 |
| 2013/0264610 A1 * | 10/2013 | Chen | B81C 1/0023 257/252 |
| 2014/0140364 A1 | 5/2014 | Charles et al. | |

OTHER PUBLICATIONS

Chiu, Yu-Tzu, Flash memory Survives 100 Million Cycles, Nov. 30, 2012, http://spectrum.ieee.org/semiconductors/memory/flash-memory-survives-100-million-cycles.
U.S. Appl. No. 62/117,037, filed Feb. 17, 2015, Walker.
U.S. Appl. No. 61/971,702, filed Mar. 28, 2014, Walker.
U.S. Appl. No. 14/265,642, filed Apr. 30, 2014, Walker.
U.S. Appl. No. 14/265,653, filed Apr. 30, 2014, Walker.
U.S. Appl. No. 14/265,668, filed Apr. 30, 2014, Walker.
U.S. Appl. No. 14/265,682, filed Apr. 30, 2014, Walker.
U.S. Appl. No. 14/265,729, filed Apr. 30, 2014, Walker.
U.S. Appl. No. 62/039,494, filed Aug. 20, 2014, Walker.
U.S. Appl. No. 14/484,529, filed Sep. 12, 2014, Walker.
U.S. Appl. No. 14/484,546, filed Sep. 12, 2014, Walker.
U.S. Appl. No. 14/484,575, filed Sep. 12, 2014, Walker.
U.S. Appl. No. 14/484,593, filed Sep. 12, 2014, Walker.
U.S. Appl. No. 14/484,620, filed Sep. 12, 2014, Walker.
U.S. Appl. No. 14/639,270, filed Mar. 5, 2015, Walker.
U.S. Appl. No. 14/639,301, filed Mar. 5, 2015, Walker.
U.S. Appl. No. 14/639,325, filed Mar. 5, 2015, Walker.
Non-final Office Action, dated Oct. 12, 2016, for U.S. Appl. No. 14/639,270.

* cited by examiner

US 9,928,925 B1

MULTI-CHIP NON-VOLATILE SEMICONDUCTOR MEMORY PACKAGE INCLUDING HEATER AND SENSOR ELEMENTS

This application claims the benefit of U.S. Provisional Patent Application Ser. No. 62/117,037, filed Feb. 17, 2015, the contents of which are incorporated by reference herein.

TECHNICAL FIELD

The present invention relates generally to a semiconductor memory device, and more particularly to thermal healing of the semiconductor memory device.

BACKGROUND OF THE INVENTION

NAND Flash memory devices are non-volatile semiconductor memory devices that can be used for solid-state storage devices. However, there are reliability issues. For example, many program and erase cycles can wear out NAND Flash memory devices by creating defects.

In light of the above, it would be desirable to provide a method of healing a non-volatile semiconductor memory device to improve reliability.

DETAILED DESCRIPTION OF THE EMBODIMENTS

According to the embodiments set forth below, a system can include a multi-chip package having a plurality of stacked Flash non-volatile semiconductor memory devices, a heater, and a thermal sensor element. The heater and thermal sensor element may be passive components controlled by a thermal control circuit. The thermal control circuit can be located on a semiconductor device not included in the multi-chip package. In this way, the heat generated by the heater may not have adverse effects on the thermal control circuit. The semiconductor device including the thermal control circuit may be a memory controller. The multi-chip package can include solder balls with a predetermined melting temperature. The thermal control circuit may sense the temperature of the multi-chip package during a healing cycle and keep the temperature of the multi-chip package in a range between a first and second temperature, the first and second temperature may be a lower temperature than the predetermined melting temperature of the solder balls.

Figure 1:
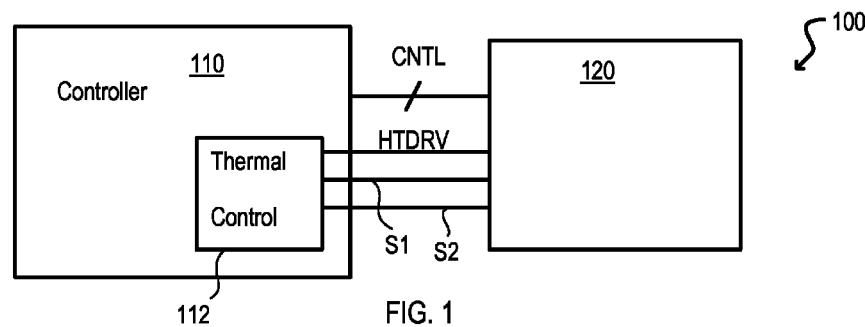
FIG. 1 is a block schematic diagram of a non-volatile memory system according to an embodiment.

Referring now to FIG. 1, a non-volatile memory system according to an embodiment is set forth in a block schematic diagram and given the general reference character 100.

Non-volatile memory system can include a controller 110 and a multi-chip package 120. Controller 110 can be a non-volatile memory controller and can provide control signals CNTL and a heater drive signal HTDRV to multi-chip package 120. Controller 110 can also have an electrical connection at sense lines (S1 and S2). Control signals CNTL can include control signals, address signals, and data signals, as just a few examples. Data signals may be bi-directional signals. Heater drive signal HTDRV can provide a current path to a heater on the multi-chip package 120. Sense lines (S1 and S2) can be used to detect a value of a thermal sensor on the multi-chip package 120. The value can be a resistance value or a potential that changes in conjunction with the change of the temperature of the multi-chip package 120. Control signals CNTL, heater drive signal HTDRV and sense lines (S1 and S2) can connect to multi-chip package through solder connections or solder balls (not shown in FIG. 1).

Controller 110 can include a thermal control circuit 112. Thermal control circuit 112 can provide heater drive signal HTDRV and may receive sense lines (S1 and S2).

Figure 2:
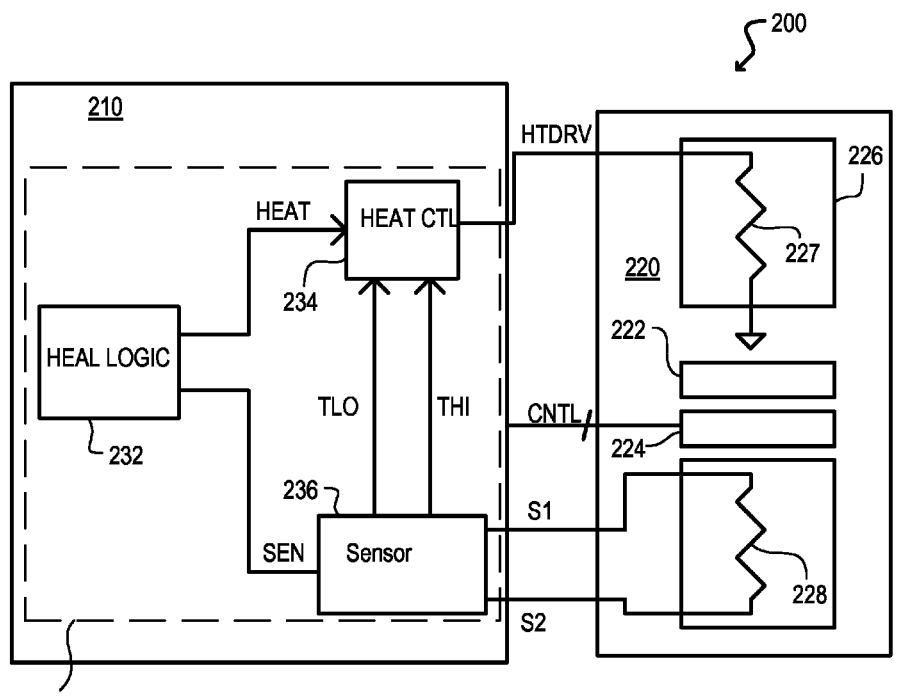
FIG. 2 is a circuit schematic diagram of non-volatile memory system according to an embodiment.

Referring now to FIG. 2, a non-volatile memory system according to an embodiment is set forth in a circuit schematic diagram and given the general reference character 200.

Non-volatile memory system 200 can include a controller 210 and a multi-chip package 220. Non-volatile memory system 200 can include similar constituents as non-volatile memory system 100. Such constituents may have the same general reference character except the first digit can be a "2" instead of a "1".

Controller 210 can be a non-volatile memory controller and can provide control signals CNTL and a heater drive signal HTDRV to multi-chip package 220. Controller 210 can also have an electrical connection at sense lines (S1 and S2).

Controller 210 can include a thermal control circuit 212. Thermal control circuit 212 can include a heal logic circuit 232, a heat control circuit 234 and a sensor circuit 236.

Heal logic circuit 232 can provide a heat enable signal HEAT and a sensor enable signal SEN. Sensor circuit 236 can receive the sensor enable signal SEN, sense lines (S1 and S2), and may provide a temperature range lower limit detect signal TLO and a temperature upper range limit detect signal THI. Heat control circuit 234 may receive heat enable signal HEAT, temperature lower range limit detect signal TLO, and temperature range upper limit detect signal THI and may provide heater drive signal HTDRV.

Multi-chip package 220 can include a plurality of non-volatile semiconductor memory devices 222, an interface control semiconductor device (memory controller) 224, a heater 226, and a thermal sensing element 228.

Heater 226 can receive heat drive signal HTDRV at a first terminal of a heater element 227 and a ground potential at a second terminal of heater element 227. Interface control semiconductor device 224 can receive control signals CNTL and may provide an interface between the plurality of non-volatile semiconductor memory devices 222 and controller 210. Thermal sensing element 228 can have a first terminal connected to sense line S1 and a second terminal connected to sense line S2.

The operation of non-volatile memory system 200 will now be explained. Heal logic 232 may detect whether a maximum number of program and erase cycles have been performed or a maximum number of errors have been detected to determine that the plurality of non-volatile semiconductor memory devices 222 need to be healed. When one of these two conditions have been met, sensor enable signal SEN may transition from a sensor disabled state to a sensor enable state to enable sensor circuit 236. At this time sensor circuit 236 can monitor a value of thermal sensing element 228 to determine whether the temperature of multi-chip package 220 is above or below a temperature lower range limit and above or below a temperature upper range limit.

Once the sensor circuit 236 is properly enabled, heal logic 232 may provide heat enable signal HEAT to transition from a heater disabled logic level to a heater enabled logic level. At this time, heat control circuit 234 can energize the heat drive signal HTDRV if the temperature of the multi-chip package 220 is below the temperature lower range limit (temperature range lower limit detect signal TLO is logic low).

With the heat drive signal HTDRV energized, a current may flow through heater element 227 to heat the multi-chip package 220. When temperature sensor circuit 236 detects the value of thermal sensing element 228 reaching a first predetermined limit, temperature lower limit value has been reached and temperature range lower limit detect signal TLO may transition to a logic high level. However, heat drive signal HTDRV may remain energized at this time and heater element 227 may continue to heat the multi-chip package 220.

When temperature sensor circuit 236 detects the value of thermal sensing element 228 reaching a second predetermined limit, temperature upper limit value has been reached and temperature range upper limit detect signal THI may transition to a logic high level. At this time, heat control circuit 234 may de-energize heat drive signal HTDRV to prevent current from flowing through heater element 227. In this way, multi-chip package 220 may begin to cool.

However, when temperature sensor circuit 236 detects the value of thermal sensing element 228 cooling to the first predetermined limit, temperature lower limit value has been reached and temperature range lower limit detect signal TLO transitioning back to a logic low level. In response to the temperature range lower limit detect signal TLO may transition back to a logic low level, heat control circuit 234 may energize heat drive signal HTDRV and current may flow through heater element 227.

This process may continue to essentially confine the temperature of multi-chip package 220 between a temperature range upper limit value (Temp2) and temperature range lower limit value (Temp1) during the healing process.

After a predetermined time period sufficient to heal the plurality of non-volatile semiconductor memory devices 222, heal logic may provide heat enable signal HEAT and sensor enable signal SEN that each transition from an enable logic level to a disable logic level (from a high logic level to a low logic level in this case).

It should be noted, before the healing process begins, data on the non-volatile memory system 200 may be backed up to another memory system. After the healing process, the data may be re-written to the non-volatile memory system 200.

By providing sensor circuit 236 separately from multi-chip package 220, multi-chip package 220 may be heated to extreme temperatures without affecting the active thermal sensing circuitry. In this way, the temperature range of multi-chip package 220 during the healing process may be more accurately attained.

Figure 3:
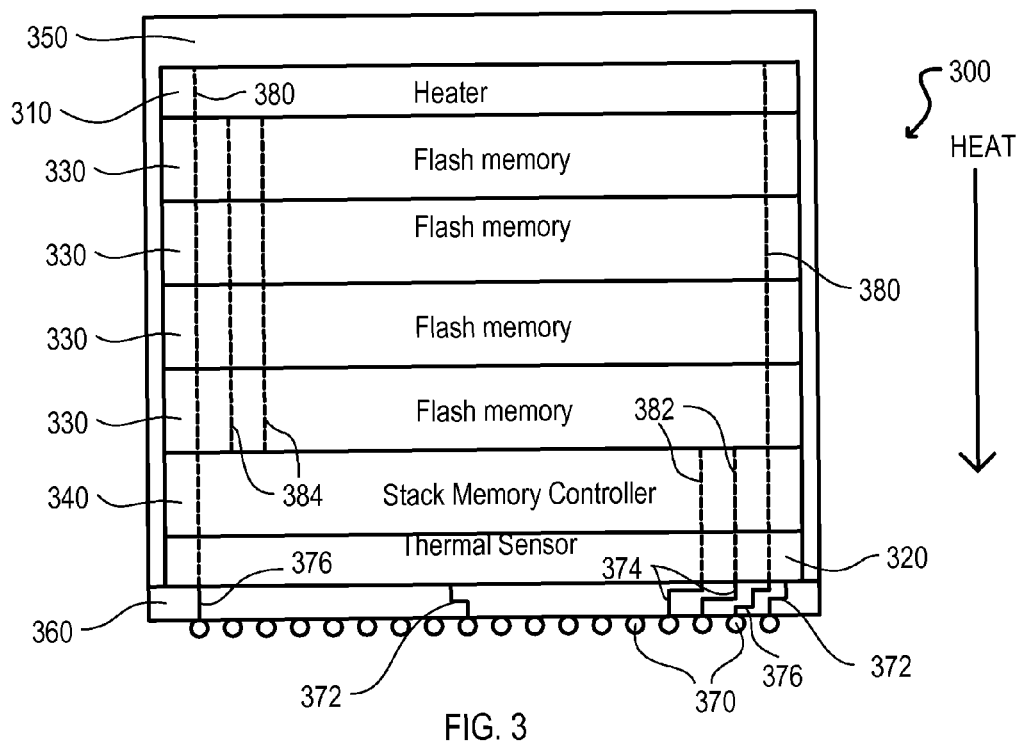
FIG. 3 is a cross-section diagram of a multi-chip package according to an embodiment.

Referring now to FIG. 3, a multi-chip package according to an embodiment is set forth in a cross-section diagram and given then general reference character 300.

Multi-chip package 300 may be used as multi-chip packages (120 and 220) in non-volatile memory systems (100 and 200) of FIGS. 1 and 2.

Multi-chip package 300 can include a heater 310, a thermal sensor 320, a plurality of non-volatile semiconductor memory devices 330, and a memory controller 340, surrounded by an encapsulation material 350. Multichip package 300 may also include a substrate 360 and solder connections 370. Solder connections 370 may be solder balls or bumps, for example.

Solder connections 370 may be formed on the bottom surface of substrate 360. Solder connections 370 may form a grid array. Thermal sensor 320 may be stacked on a top surface of substrate 360. Memory controller 340 may be on top of thermal sensor 320. The plurality of non-volatile semiconductor memory devices 330 may be stacked successively on top of memory controller 340. Heater 310 may be stacked on top of the uppermost non-volatile semiconductor memory device 330. In this way, heater 310 and thermal sensor 320 may sandwich the plurality of non-volatile semiconductor memory devices 330 and memory controller 340.

Substrate 360 can include interconnects (372, 374, and 376) that provide an electrical connections from respective solder connections 370 and through substrate 360. It is understood that there can be an interconnect for each solder connection 370, however, only a select few interconnects are illustrated in order to avoid unduly cluttering up the figure.

Interconnects 372 may provide electrical connections between solder connections 370 and respective terminals on a thermal sensing element (228 of FIG. 2) on thermal sensor 320.

Multi-chip package 300 can include vias (380, 382, and 384). Vias (380, 382, and 384) may provide electrical connections through predetermined ones of thermal sensor 320, plurality of non-volatile semiconductor memory devices 330, and memory controller 340.

Interconnects 374, in conjunction with vias 382 may provide electrical connections between memory controller 340 and respective solder connections 370. Vias 382 may be formed through thermal sensor 320. Interconnects 376 in conjunction with vias 380 may provide electrical connections between heater 310 and solder connections 370. Vias 380 may be formed through thermal sensor 320, memory controller 340, and the plurality of non-volatile semiconductor memory devices 330 to provide an electrical connection to respective terminals of a heater element 227 (FIG. 2). Vias 384 may provide an electrical connection between memory controller 340 and the plurality of non-volatile semiconductor memory devices 330. Vias 384 may be formed through the plurality of non-volatile semiconductor memory devices 330.

Figure 4:
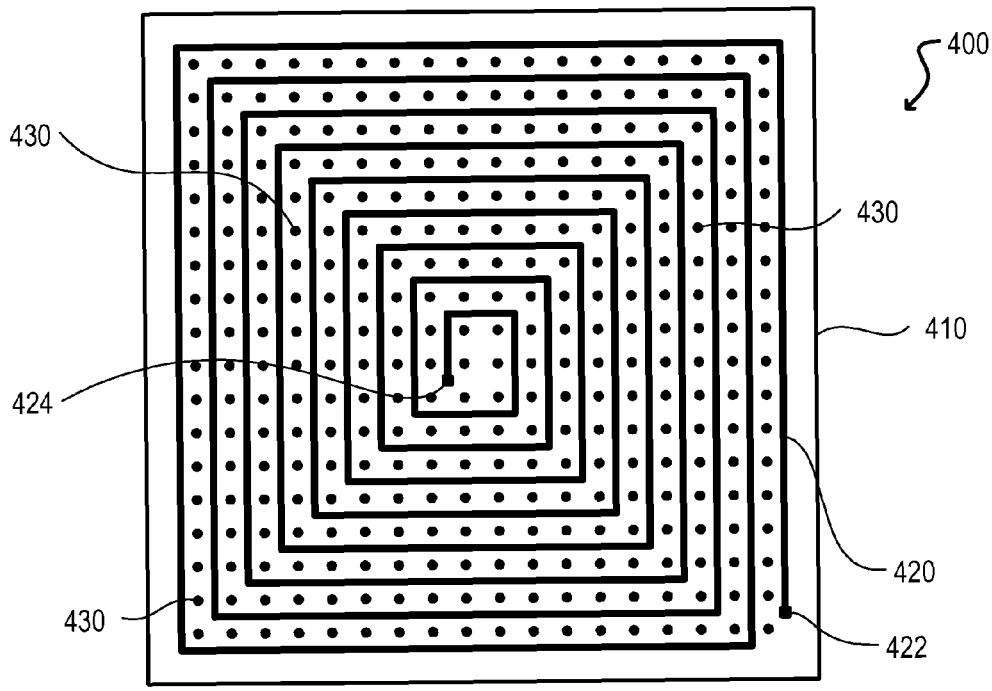
FIG. 4 is a top view diagram of a thermal sensor according to an embodiment.

Referring now to FIG. 4, a top view diagram of a thermal sensor according to an embodiment is set forth and given the general reference character 400. Thermal sensor 400 may be used as thermal sensors (228 and 320) in FIGS. 2 and 3, respectively.

Thermal sensor 400 may include a substrate 410 and a thermal sensing element 420. Vias 430 may be formed through substrate 410. Vias 430 may be formed in an grid array pattern and may provide electrical connections through substrate 410.

Thermal sensing element 420 may include a first terminal 422 and a second terminal 424. Each of first and second terminals (422 and 424) may be electrically connected to a respective interconnect 372 (FIG. 3) to provide electrical connections to a respective solder connection 370 (FIG. 3).

Thermal sensing element 420 may be formed in a pattern between vias 430. Thermal sensor 400 shows thermal sensing element 420 forming a spiral, however, other shapes may be used, such as a back and forth zig-zag pattern, as just one other example.

Thermal sensing element 420 may be a resistor formed from a conductor that has a temperature coefficient of resistance such that the resistance of the thermal sensing element changes as temperature changes. Examples of materials that may be used for thermal sensing element 420 when thermal sensing element is a resistor are: silver, copper, aluminum, tungsten, and platinum.

Figure 5:
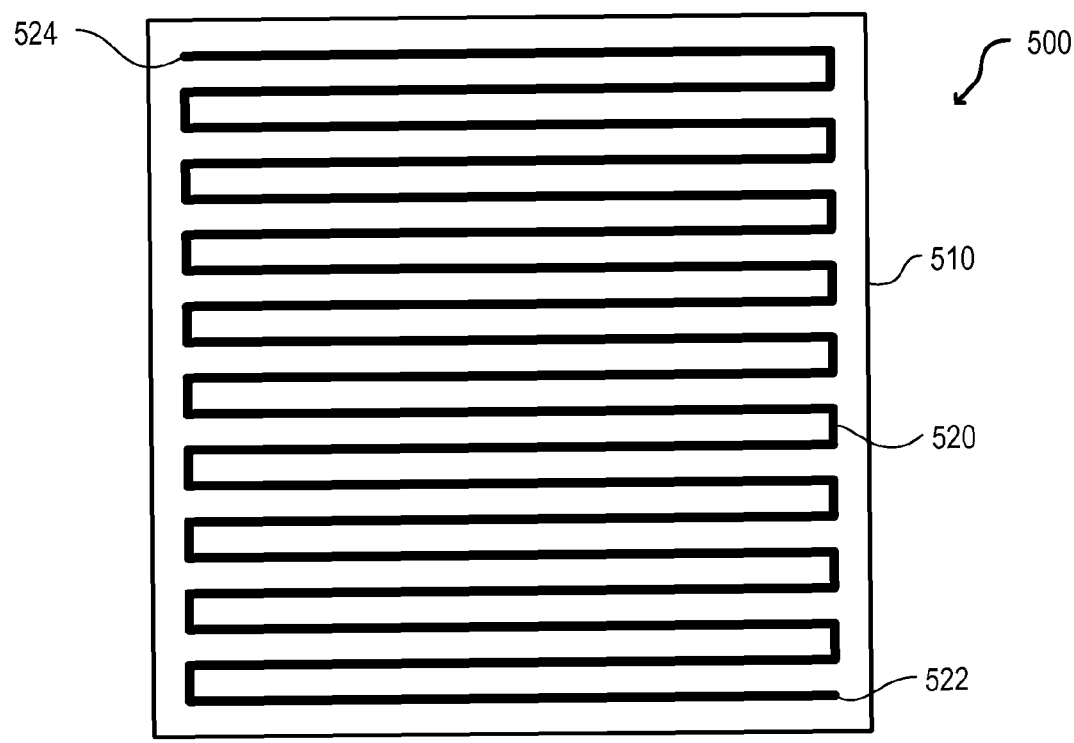
FIG. 5 is a top view diagram of a heater according to an embodiment.

Referring now to FIG. 5, a top view diagram of a heater according to an embodiment is set forth and given the general reference character 500. Heater 500 may be used as heaters (226 and 310) in FIGS. 2 and 3, respectively.

Heater 500 may include a substrate 510 and a heater element 520.

Heater element 520 may include a first terminal 522 and a second terminal 524. Each of first and second terminals (522 and 524) may be electrically connected to a respective via 380 and respective interconnect 376 (FIG. 3) to provide electrical connections to a respective solder connection 370 (FIG. 3).

Heater element 520 may form a zig-zag pattern. Heater element 520 may form other patterns, for example, a spiral pattern.

Heater element 520 may have a thermal conductivity and may give off energy in the form of heat when current flows through heater element 520. Examples of materials that may be used for heater element 520 are: polysilicon, platinum, and polyimide.

Figure 6:
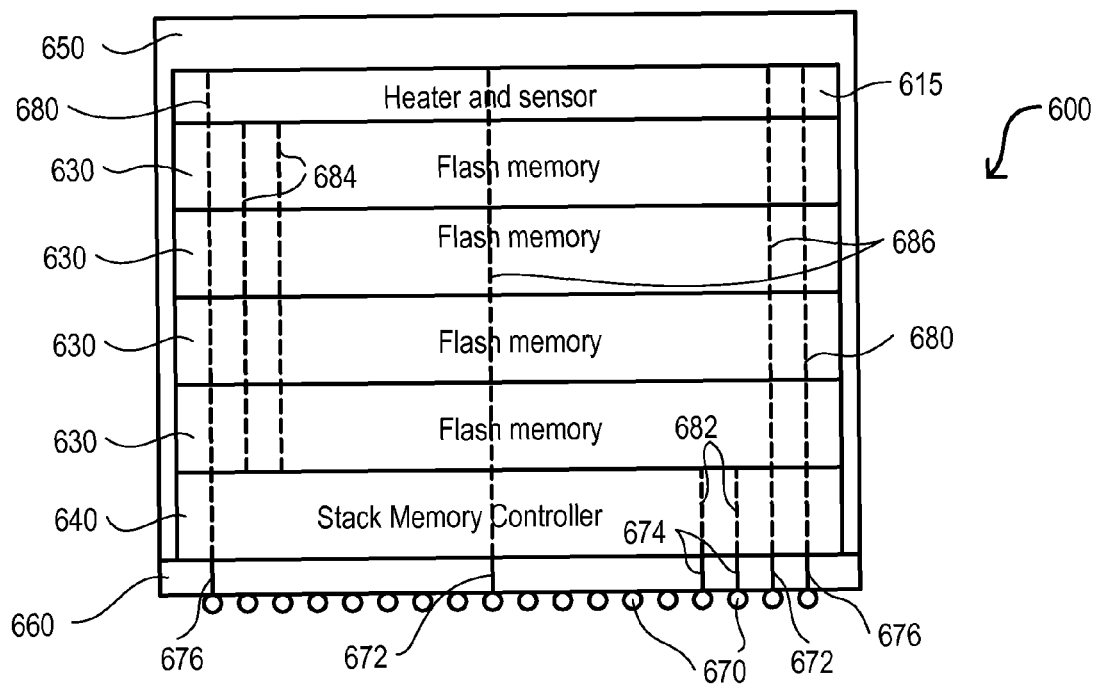
FIG. 6 is a cross-section diagram of a multi-chip package according to an embodiment.

Referring now to FIG. 6, a multi-chip package according to an embodiment is set forth in a cross-section diagram and given then general reference character 600.

Multi-chip package 600 may be used as multi-chip packages (120 and 220) in non-volatile memory systems (100 and 200) of FIGS. 1 and 2.

Multi-chip package 600 can include a heater and thermal sensor 615, a plurality of non-volatile semiconductor memory devices 630, and a memory controller 640 surrounded by an encapsulation material 650. Multichip package 600 may also include a substrate 660 and solder connections 670. Solder connections 670 may be solder balls or bumps, for example.

Solder connections 670 may be formed on the bottom surface of substrate 660. Solder connections 670 may form a grid array. Memory controller 640 may be stacked on top surface of substrate 660. The plurality of non-volatile semiconductor memory devices 630 may be stacked successively on top of memory controller 640. Heater and thermal sensor 615 may be stacked on top of the uppermost non-volatile semiconductor memory device 630. In this way, heater 615 and substrate 660 may sandwich the plurality of non-volatile semiconductor memory devices 630 and memory controller 640.

Substrate 660 can include interconnects (672, 674, and 676) that provide electrical connections from respective solder connections 670 and through substrate 660. It is understood that there can be an interconnect for each solder connection 670, however, only a select few interconnects are illustrated in order to avoid unduly cluttering up the figure.

Interconnects 672 may provide electrical connections between solder connections 670 and respective terminals on heater and thermal sensor 615.

Multi-chip package 600 can include vias (680, 682, 684, and 686). Vias (680, 682, 684, and 686) may provide electrical connections through predetermined ones of plurality of non-volatile semiconductor memory devices 630, and memory controller 640.

Interconnects 674, in conjunction with vias 682 may provide electrical connections between memory controller 640 and respective solder connections 670. Interconnects 676, in conjunction with vias 680, and interconnects 672, in conjunctions with vias 686, may provide electrical connections between heater and thermal sensor 615 and respective solder connections 670. Vias (680 and 686) may be formed through memory controller 640, and the plurality of non-volatile semiconductor memory devices 630 to provide an electrical connection to respective terminals of elements in heater and thermal sensor 615. Vias 684 may provide an electrical connection between memory controller 640 and the plurality of non-volatile semiconductor memory devices 630. Vias 684 may be formed through the plurality of non-volatile semiconductor memory devices 630.

Figure 7:
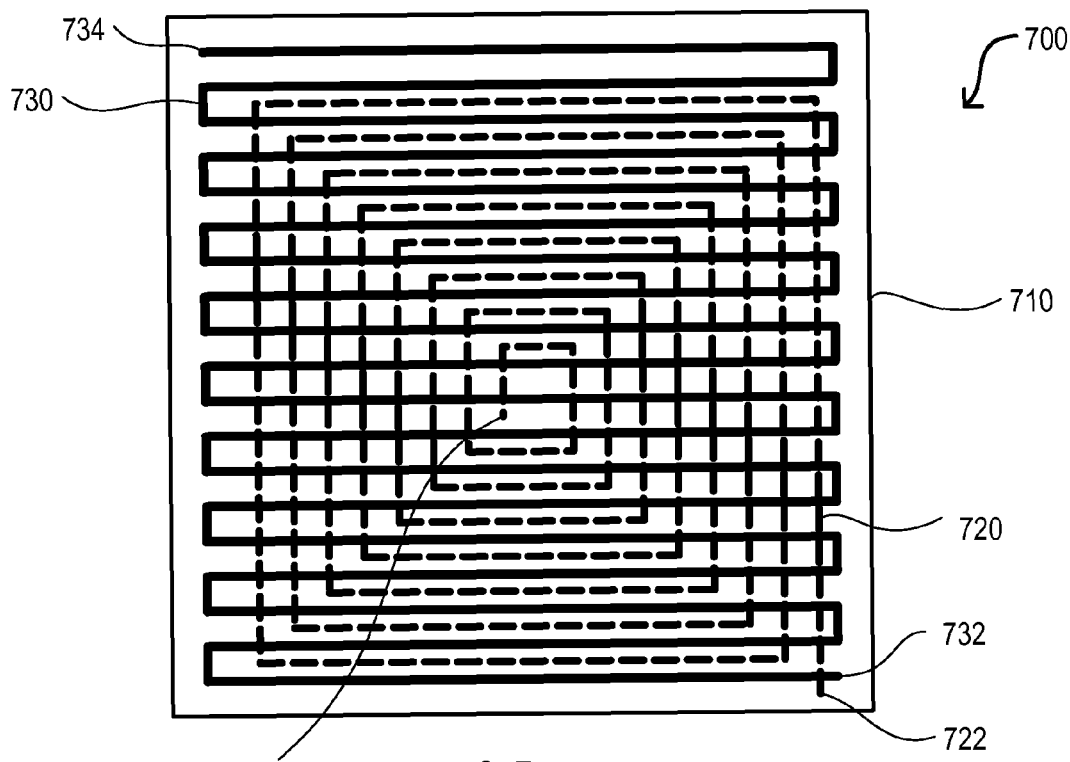
FIG. 7 is a top view diagram of a heater and thermal sensor according to an embodiment.

Referring now to FIG. 7, a top view diagram of a heater and thermal sensor according to an embodiment is set forth and given the general reference character 700. Heater and thermal sensor 700 may be used as heater and thermal sensor 615 in FIG. 6.

Heater and thermal sensor 700 may include a substrate 710, a thermal sensing element 720 and a heater element 730.

Thermal sensing element 720 may include a first terminal 722 and a second terminal 724. Each of first and second terminals (722 and 724) may be electrically connected to a respective vias 686 and interconnect 672 (FIG. 6) to provide electrical connections to a respective solder connection 670 (FIG. 6).

Thermal sensing element 720 may be formed in a spiral pattern, however, other shapes may be used, such as a back and forth zig-zag pattern, as just one other example.

Thermal sensing element 720 may be a resistor formed from a conductor that has a temperature coefficient of resistance such that the resistance of the thermal sensing element changes as temperature changes. Examples of materials that may be used for thermal sensing element 720 when thermal sensing element is a resistor are: silver, copper, aluminum, tungsten, and platinum.

Heater element 730 may include a first terminal 732 and a second terminal 734. Each of first and second terminals (732 and 734) may be electrically connected to a respective via 680 and respective interconnect 676 (FIG. 6) to provide electrical connections to a respective solder connection 670 (FIG. 6).

Heater element 730 may form a zig-zag pattern. Heater element 730 may form other patterns, for example, a spiral pattern.

Heater element 730 may have a thermal conductivity and may give off energy in the form of heat when current flows through heater element 730. Examples of materials that may be used for heater element 730 are: polysilicon, platinum, and polyimide.

Thermal sensing element 720 may be formed in a layer under heater element 730 with an electrical insulating layer formed there-between and on substrate 710.

Figure 8:
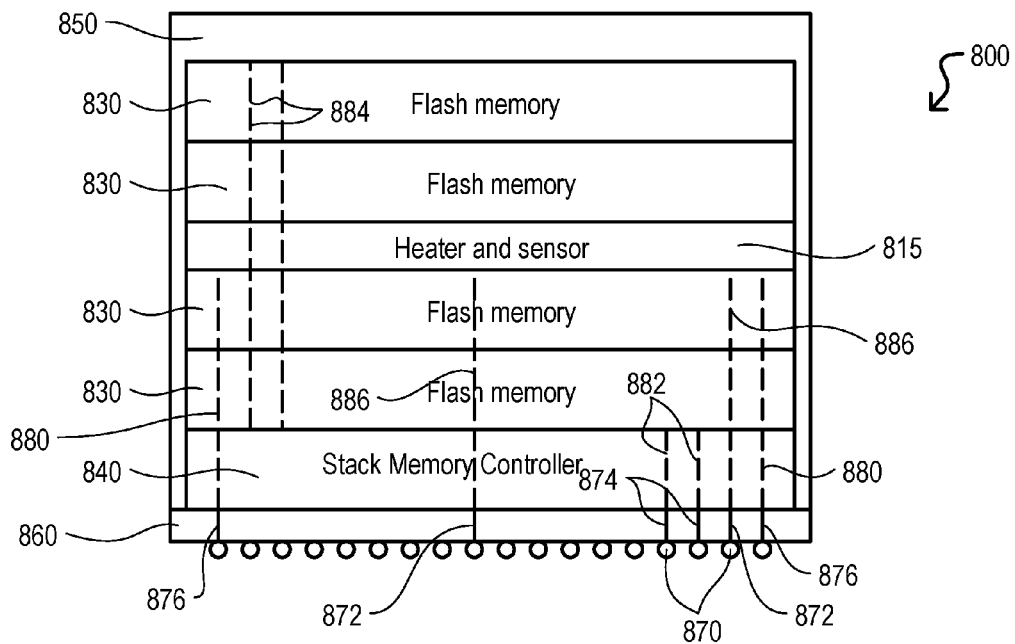
FIG. 8 is a cross-section diagram of a multi-chip package according to an embodiment.

Referring now to FIG. 8, a multi-chip package according to an embodiment is set forth in a cross-section diagram and given the general reference character 800.

Multi-chip package 800 may be used as multi-chip packages (120 and 220) in non-volatile memory systems (100 and 200) of FIGS. 1 and 2.

Multi-chip package 800 can include a heater and thermal sensor 815, a plurality of non-volatile semiconductor memory devices 830, and a memory controller 840 surrounded by an encapsulation material 850. Multichip package 800 may also include a substrate 860 and solder connections 870. Solder connections 870 may be solder balls or bumps, for example.

Solder connections 870 may be formed on the bottom surface of substrate 860. Solder connections 870 may form a grid array. Memory controller 840 may be stacked on a top surface of substrate 860. Two of the plurality of non-volatile semiconductor memory devices 830 may be stacked successively on top of memory controller 840. Heater and thermal sensor 815 may be stacked on top of the two of the plurality of non-volatile semiconductor memory devices 830. Two more of the plurality of non-volatile semiconductor memory devices 830 may be stacked successively on top of heater and thermal sensor 815. In this way, heater and thermal sensor 815 and substrate 860 may sandwich the two of the plurality of non-volatile semiconductor memory devices 830 and memory controller 840. Heater and thermal sensor 815 may be essentially in the middle of the plurality of non-volatile semiconductor memory devices 830 such that a first plurality of non-volatile semiconductor memory devices 830 may be formed below heater and thermal sensor 815 and a second plurality of non-volatile semiconductor memory devices 830 may be formed above heater and thermal sensor 815.

Substrate 860 can include interconnects (872, 874, and 876) that provide electrical connections from respective solder connections 870 and through substrate 860. It is understood that there can be an interconnect for each solder connection 870, however, only a select few interconnects are illustrated in order to avoid unduly cluttering up the figure.

Interconnects 872, in conjunction with vias 886, may provide electrical connections between solder connections 870 and respective terminals on heater and thermal sensor 815.

Multi-chip package 800 can include vias (880, 882, 884, and 886). Vias (880, 884, and 886) may provide electrical connections through predetermined ones of plurality of non-volatile semiconductor memory devices 830, and memory controller 840.

Interconnects 874, in conjunction with vias 882 may provide electrical connections between memory controller 840 and respective solder connections 870. Interconnects 876, in conjunction with vias 880, and interconnects 872, in conjunctions with vias 886, may provide electrical connections between heater and thermal sensor 815 and respective solder connections 870. Vias (880 and 886) may be formed through memory controller 840, and the first plurality of non-volatile semiconductor memory devices 830 formed under heater and thermal sensor 815 to provide an electrical connection to respective terminals of elements in heater and thermal sensor 815. Vias 884 may provide an electrical connection between memory controller 840 and the plurality of non-volatile semiconductor memory devices 830. Vias 884 may be formed through heater and thermal sensor 815 and the first and second plurality of non-volatile semiconductor memory devices 830.

Figure 9:
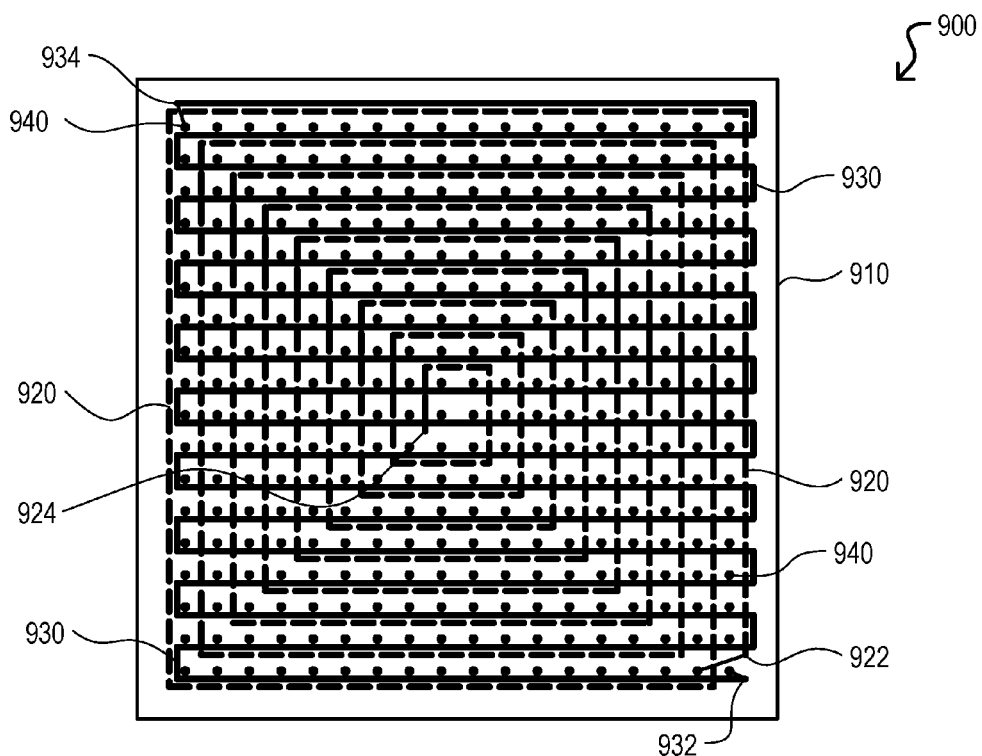
FIG. 9 is a top view diagram of a heater and thermal sensor according to an embodiment.

Referring now to FIG. 9, a top view diagram of a heater and thermal sensor according to an embodiment is set forth and given the general reference character 900. Heater and thermal sensor 900 may be used as heater and thermal sensor 815 in FIG. 8.

Heater and thermal sensor 900 may include a substrate 910, a thermal sensing element 920, a heater element 930, and vias 940.

Thermal sensing element 920 may include a first terminal 922 and a second terminal 924. Each of first and second terminals (922 and 924) may be electrically connected to a respective vias 886 and interconnect 872 (FIG. 8) to provide electrical connections to a respective solder connection 870 (FIG. 8).

Thermal sensing element 920 may be formed in a spiral pattern, however, other shapes may be used, such as a back and forth zig-zag pattern, as just one other example.

Thermal sensing element 920 may be a resistor formed from a conductor that has a temperature coefficient of resistance such that the resistance of the thermal sensing element changes as temperature changes. Examples of materials that may be used for thermal sensing element 920 when thermal sensing element is a resistor are: silver, copper, aluminum, tungsten, and platinum.

Heater element 930 may include a first terminal 932 and a second terminal 934. Each of first and second terminals (932 and 934) may be electrically connected to a respective via 880 and respective interconnect 876 (FIG. 8) to provide electrical connections to a respective solder connection 870 (FIG. 8).

Heater element 930 may form a zig-zag pattern. Heater element 930 may form other patterns, for example, a spiral pattern.

Heater element 930 may have a thermal conductivity and may give off energy in the form of heat when current flows through heater element 930. Examples of materials that may be used for heater element 930 are: polysilicon, platinum, and polyimide.

Thermal sensing element 920 may be formed in a layer under heater element 930 with an electrical insulating layer formed there-between and on substrate 910.

Figure 10:
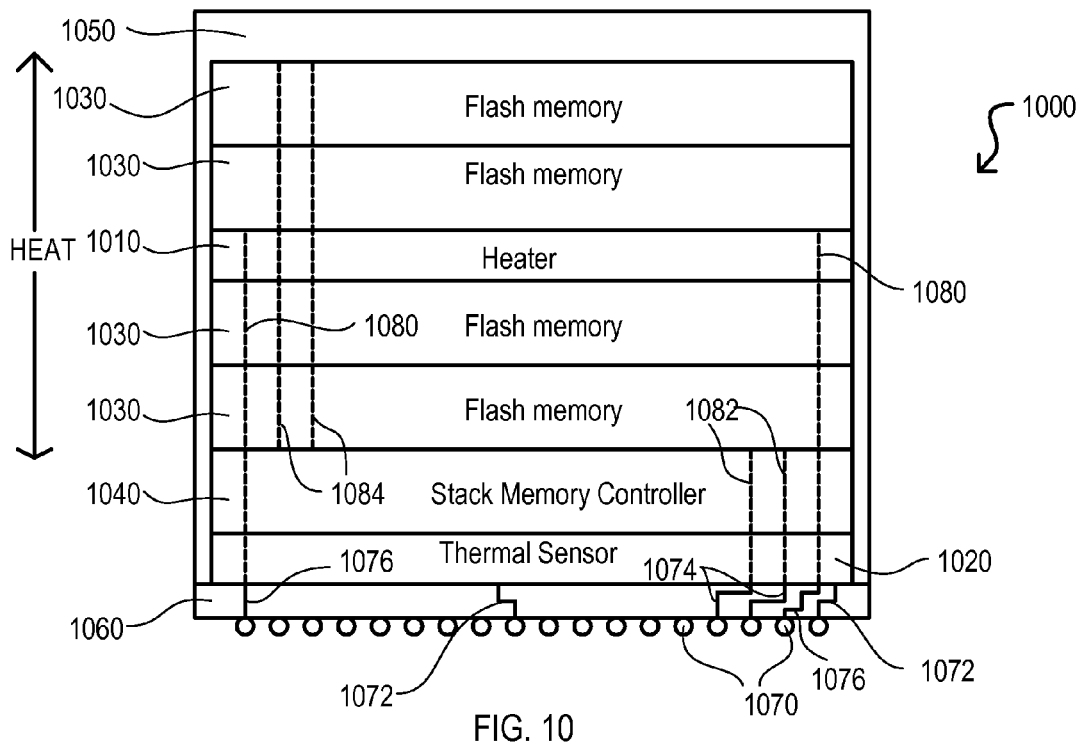
FIG. 10 is a cross-section diagram of a multi-chip package according to an embodiment.

Referring now to FIG. 10, a multi-chip package according to an embodiment is set forth in a cross-section diagram and given the general reference character 1000.

Multi-chip package 1000 may be used as multi-chip packages (120 and 220) in non-volatile memory systems (100 and 200) of FIGS. 1 and 2.

Multi-chip package 1000 can include a heater 1010, a thermal sensor 1020, a plurality of non-volatile semiconductor memory devices 1030, and a memory controller 1040, surrounded by an encapsulation material 1050. Multi-chip package 1000 may also include a substrate 1060 and solder connections 1070. Solder connections may be solder balls or bumps, for example.

Solder connections 1070 may be formed on the bottom surface of substrate 1060. Solder connections 1070 may form a grid array. Thermal sensor 1020 may be stacked on a top surface of substrate 1060. Memory controller 1040 may be stacked on top of thermal sensor 1020. A first plurality of non-volatile semiconductor memory devices 1030 may be stacked successively on top of memory controller 1040. Heater 1010 may be stacked on top of the uppermost non-volatile semiconductor memory device 1030 of the first plurality of non-volatile semiconductor memory devices 1030. In this way, heater 1010 and thermal sensor 1020 may sandwich the first plurality of non-volatile semiconductor memory devices 1030 and memory controller 1040. A second plurality of non-volatile semiconductor memory devices 1030 may be on top of the heater 1010. In this way, heater 1010 may be disposed in between a plurality of non-volatile semiconductor memory devices 1030 and in a central portion of multi-chip package 1000.

Substrate 1070 can include interconnects (1072, 1074, and 1076) that provide electrical connections from respective solder connections 1070 and through substrate 1060. It is understood that there can be an interconnect for each solder connection 1070, however, only a select few interconnects are illustrated in order to avoid unduly cluttering up the figure.

Interconnects 1072 may provide electrical connections between solder connections 1070 and respective terminals on a thermal sensing element (228 of FIG. 2) on thermal sensor 1020.

Multi-chip package 1000 can include vias (1080, 1082, and 1084). Vias (1080, 1082, and 1084) may provide electrical connections through predetermined ones of thermal sensor 1020, heater 1010, plurality of non-volatile semiconductor memory devices 1030, and memory controller 1040.

Interconnects 1074, in conjunction with vias 1082 may provide electrical connections between memory controller 1040 and respective solder connections 1070. Vias 1082 may be formed through thermal sensor 1020. Interconnects 1074 in conjunction with vias 1080 may provide electrical connections between heater 1010 and solder connections 1070. Vias 1080 may be formed through thermal sensor 1020, memory controller 1040, and the first plurality of non-volatile semiconductor memory devices 1030 to provide an electrical connection to respective terminals of a heater element 227 (FIG. 2). Vias 1084 may provide an electrical connection between memory controller 1040 and the plurality of non-volatile semiconductor memory devices 1030. Vias 1084 may be formed through the plurality of non-volatile semiconductor memory devices 1030 and heater 1010.

Thermal sensor 1020 may be essentially the same as thermal sensor 400 illustrated in FIG. 4.

Figure 11:
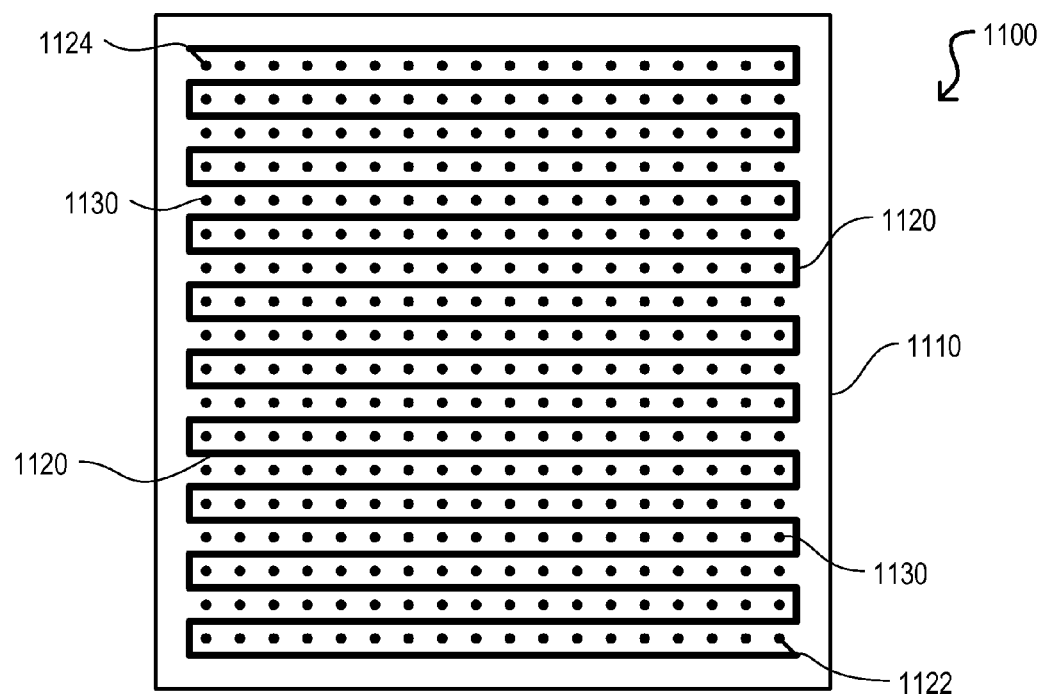
FIG. 11 is a top view diagram of a heater according to an embodiment.

Referring now to FIG. 11, a top view diagram of a heater according to an embodiment is set forth and given the general reference character 1100. Heater 1100 may be used as heaters (226 and 1010) in FIGS. 2 and 10, respectively.

Heater 1000 may include a substrate 1110, a heater element 1120 and vias 1130. Vias 1130 may be formed through substrate 1110. Vias 1130 may be formed in an grid array pattern and may provide electrical connections through substrate 1110.

Heater element 1120 may include a first terminal 1122 and a second terminal 1124. Each of first and second terminals (1122 and 1124) may be electrically connected to a respective via 1080 and respective interconnect 1076 (FIG. 10) to provide electrical connections to a respective solder connection 1070 (FIG. 10).

Heater element 1120 may be formed in a pattern between vias 1130. Heater element 1120 may form a zig-zag pattern. Heater element 1120 may form other patterns, for example, a spiral pattern.

Heater element 1120 may have a thermal conductivity and may give off energy in the form of heat when current flows through heater element 1120. Examples of materials that may be used for heater element 1120 are: polysilicon, platinum, and polyimide.

Figure 12:
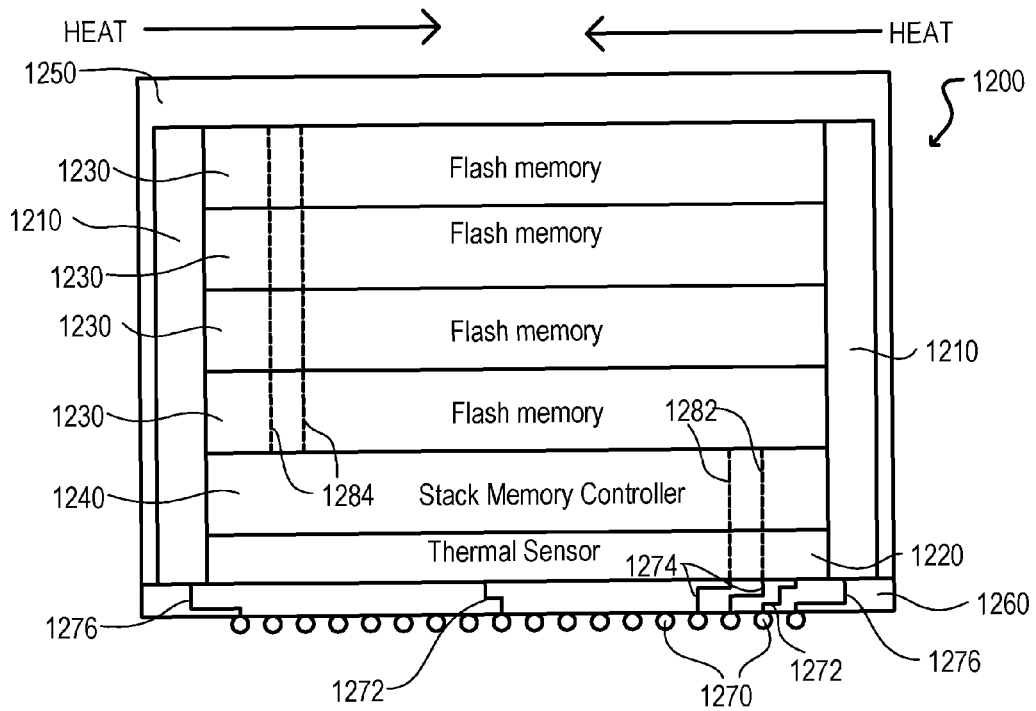
FIG. 12 is a cross-section diagram of a multi-chip package according to an embodiment.

Referring now to FIG. 12, a multi-chip package according to an embodiment is set forth in a cross-section diagram and given then general reference character 1200.

Multi-chip package 1200 may be used as multi-chip packages (120 and 220) in non-volatile memory systems (100 and 200) of FIGS. 1 and 2.

Multi-chip package 1200 can include first and second heaters 1210, a thermal sensor 1220, a plurality of non-volatile semiconductor memory devices 1230, and a memory controller 1240, surrounded by an encapsulation material 1250. Multichip package 1200 may also include a substrate 1260 and solder connections 1270. Solder connections 1270 may be solder balls or bumps, for example.

Solder connections 1270 may be formed on the bottom surface of substrate 1260. Solder connections 1270 may form a grid array. Thermal sensor 1220 may be stacked on a top surface of substrate 1260. Memory controller 1240 may be on stacked top of thermal sensor 1220. The plurality of non-volatile semiconductor memory devices 1230 may be stacked successively on top of memory controller 1240. First and second heaters 1210 may be on respective side surfaces of the stack of non-volatile semiconductor memory devices 1230. In this way, first and second heaters 1210 may be positioned orthogonal or perpendicular to and may sandwich the plurality of non-volatile semiconductor memory devices 1230, memory controller 1240, and thermal sensor 1220.

Substrate 1270 can include interconnects (1272, 1274, and 1276) that provide electrical connections from respective solder connections 1270 and through substrate 1260. It is understood that there can be an interconnect for each solder connection 1270, however, only a select few interconnects are illustrated in order to avoid unduly cluttering up the figure.

Interconnects 1272 may provide electrical connections between solder connections 1270 and respective terminals on a thermal sensing element (228 of FIG. 2) on thermal sensor 1220.

Multi-chip package 1200 can include vias (1282 and 1284). Vias (1282 and 1284) may provide electrical connections through predetermined ones of thermal sensor 1220, plurality of non-volatile semiconductor memory devices 1230, and memory controller 1240.

Interconnects 1274, in conjunction with vias 1282 may provide electrical connections between memory controller 1240 and respective solder connections 1270. Vias 1282 may be formed through thermal sensor 1220. Interconnects 1276 may provide electrical connections between respective heaters 1210 and solder connections 1270. Vias 1284 may provide an electrical connection between memory controller 1240 and the plurality of non-volatile semiconductor memory devices 1230. Vias 1284 may be formed through the plurality of non-volatile semiconductor memory devices 1230.

Thermal sensor 1220 may be essentially the same as thermal sensor 400 illustrated in FIG. 4.

By placing first and second heaters 1210 on a side surface of a stack of non-volatile semiconductor memory devices 1230, heat may flow from both sides and toward a center of the multi-chip package 1200.

Figure 13:
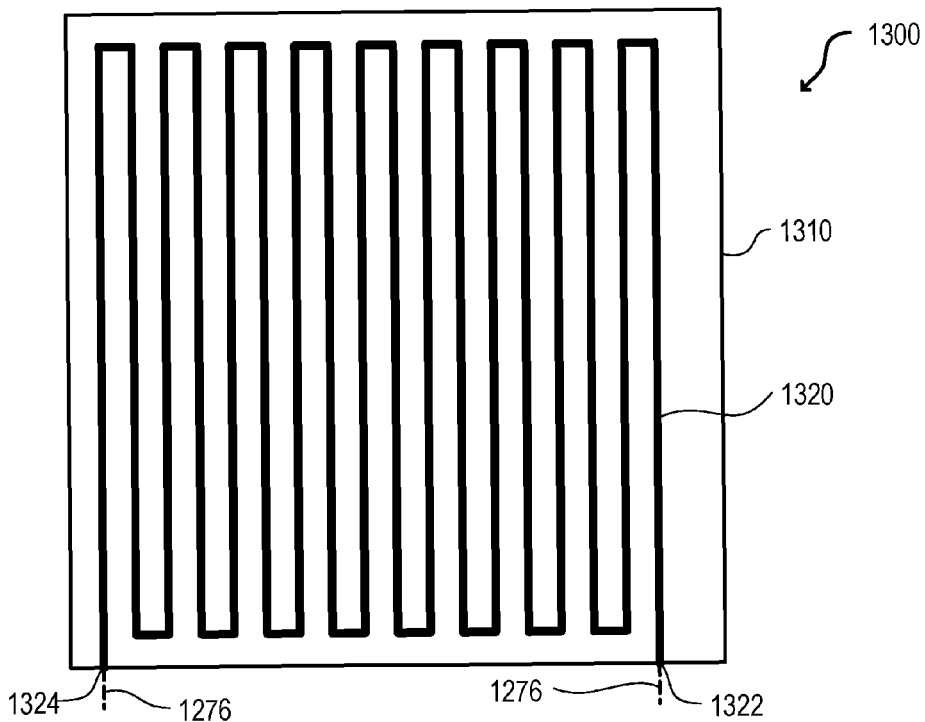
FIG. 13 is a top view diagram of a heater according to an embodiment.

Referring now to FIG. 13, a top view diagram of a heater according to an embodiment is set forth and given the general reference character 1300. Heater 1300 may be used as heaters (226 and 1210) in FIGS. 2 and 12, respectively. It is noted that the view of heater 1300 may be from the right side of heater 1210 illustrated on the left side of FIG. 12 or from the left side of heater 1210 illustrated on the right side of FIG. 12. In other words, the first and second heaters 1210 of FIG. 12 are turned on their side and vertically disposed.

Heater 1300 may include a substrate 1310 and a heater element 1320.

Heater element 1320 may include a first terminal 1322 and a second terminal 1324. Each of first and second terminals (1322 and 1324) may be electrically connected to a respective respective interconnect 1276 to provide electrical connections to a respective solder connection 1270 (FIG. 12).

Heater element 1320 may form a zig-zag pattern. Heater element 1320 may form other patterns, for example, a spiral pattern.

Heater element 1320 may have a thermal conductivity and may give off energy in the form of heat when current flows through heater element 1320. Examples of materials that may be used for heater element 1320 are: polysilicon, platinum, and polyimide.

Figure 14:
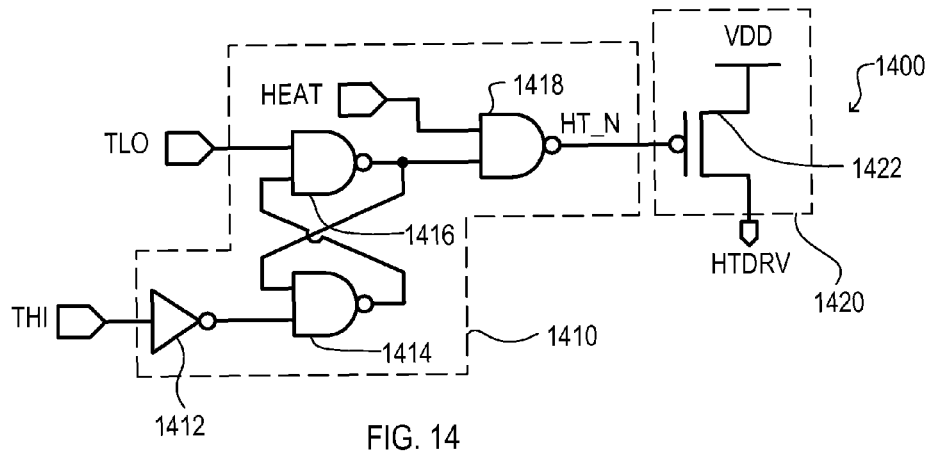
FIG. 14 is circuit schematic diagram of a heat control circuit according to an embodiment.

Referring now to FIG. 14, a heat control circuit according to an embodiment is set forth in a circuit schematic diagram and given the general reference character 1400. Heat control circuit 1400 can be used as heat control circuit 234 in thermal control circuit 212 illustrated in non-volatile memory system 200 of FIG. 2.

Heat control circuit 1400 can receive temperature range lower limit detect signal TLO, temperature range upper limit detect signal THI, and heat enable signal HEAT and may provide heater drive signal HTDRV.

Heat control circuit 1400 can include a control circuit 1410 and a driver circuit 1420. Control circuit 1410 can receive temperature range lower limit detect signal TLO, temperature range upper limit detect signal THI, and heat enable signal HEAT and may provide a heater drive enable signal HT_N. Driver circuit 1420 can receive heater drive enable signal HT_N and may provide heater drive signal HTDRV.

Control circuit 1410 can include logic gate circuits (1412, 1414, 1416, and 1418). Logic gate circuit 1412 can receive temperature range upper limit detect signal THI at an input terminal and may provide an output at an output terminal. Logic gate circuit 1412 can be an inverter logic circuit. Logic gate circuit 1414 can receive the output of logic gate circuit 1412 at a first input terminal and an output from logic gate circuit 1416 at a second input terminal and may provide an output at an output terminal. Logic gate circuit 1414 can be a NAND logic circuit. Logic gate circuit 1416 can receive the output of logic gate circuit 1414 at a first input terminal and temperature range lower limit detect signal TLO at a second input terminal and may provide an output at an output terminal. Logic gate circuit 1416 can be a NAND logic circuit. Logic gate circuit 1418 may receive the output of logic gate circuit 1416 at a first input terminal and heat enable signal HEAT at a second input terminal and may provide heater drive enable signal HT_N at an output terminal. Logic gate circuit 1418 can be a NAND logic circuit.

Logic gate circuits (1414 and 1416) may form a flip-flop circuit.

Driver circuit 1420 can include an insulated gate field effect transistor (IGFET) 1422. IGFET 1422 can receive heater drive enable signal HT_N at a gate control terminal, a supply potential VDD at a source terminal, and may provide heater drive signal HTDRV at a drain terminal. IGFET 1422 can be a p-channel IGFET.

Figure 15:
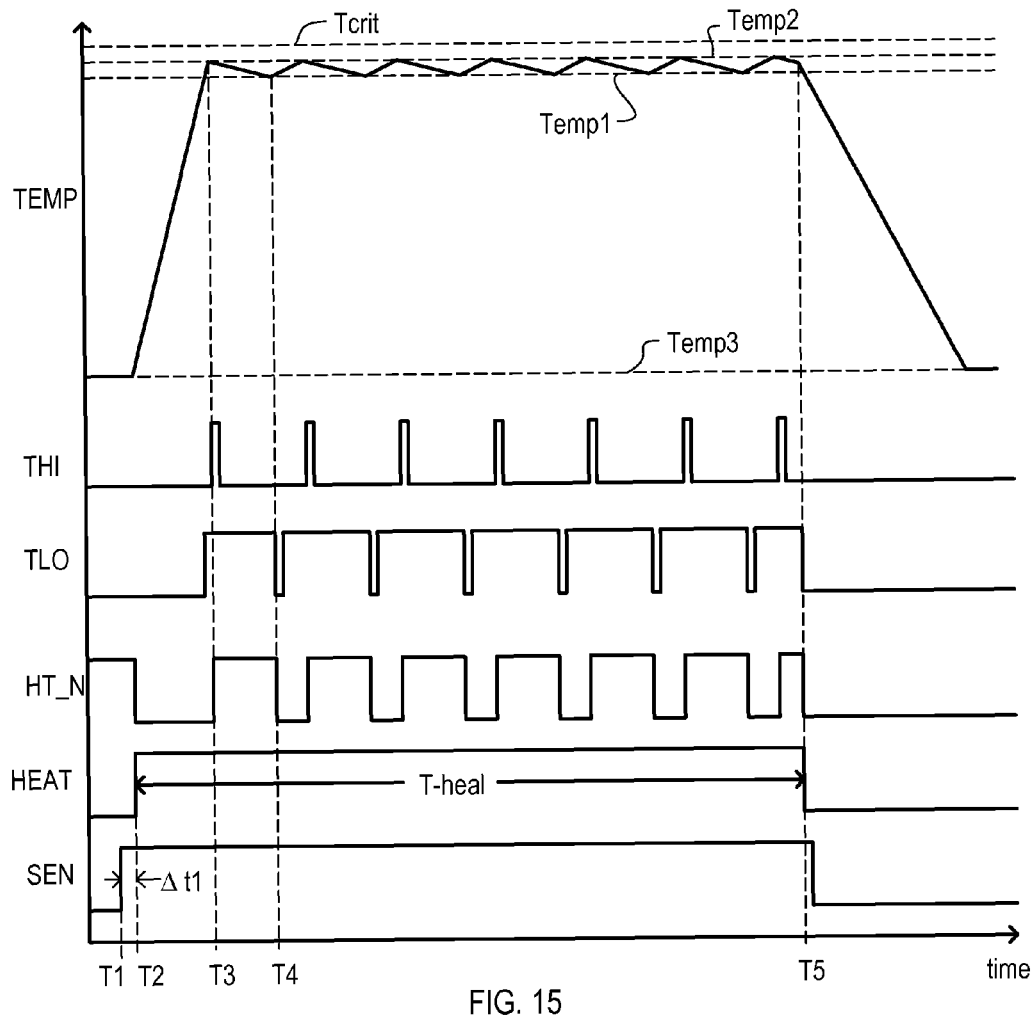
FIG. 15 is a timing diagram illustrating the operation of non-volatile memory system during a heal operation according to an embodiment.

Referring now to FIG. 15, a timing diagram illustrating the operation of a non-volatile memory system during a heal operation according to an embodiment is set forth. Non-volatile memory system can be non-volatile memory systems (100 and 200).

The timing diagram of FIG. 15 can include sensor enable signal SEN, heat enable signal HEAT, heater drive enable signal HT_N, temperature range lower limit detect signal TLO, temperature range upper limit detect signal THI, and temperature TEMP. Temperature TEMP may be a temperature at a temperature sensor element 228.

Before time T1, heal logic 232 (FIG. 2) can detect that a maximum number of write/erase cycles have been performed or a maximum number of errors have been reached by multi-chip package (120 or 220). In response the data stored in multi-chip package can be transferred to another memory device or devices outside of multi-chip package (120 or 220).

At time T1, sensor enable signal SEN may transition from a logic low to a logic high. In this way, sensor circuit 236 may be enabled and current may flow through sense lines (S1 and S2) to determine whether the temperature at thermal sensing element 228 is below a temperature lower range limit value Temp1 and temperature range upper limit value Temp2, or between a temperature range lower limit value Temp1 and temperature range upper limit value Temp2, or above a temperature range upper limit value Temp2. Because the temperature at temperature sensing element 228 has a temperature Temp3 at this time, which is less than temperature range lower limit value Temp1, both temperature range lower limit detect signal TLO and temperature range upper limit detect signal THI are at a logic low level. Temperature Temp3 is essentially a normal operating temperature of multi-chip package (120 and 220).

With temperature range lower limit detect signal TLO at a logic low level, the output of logic gate circuit 1416 can be at a logic high level. With temperature range upper limit detect signal THI at a logic low level and the output of logic gate circuit 1416 at a logic high level, the output of logic gate circuit 1414 can be at a logic low level. In this way, the logic high output of logic gate circuit 1416 can be latched at a logic high level and can only be reset by temperature range upper limit detect signal THI transitioning from a logic low level to a logic high level.

Also, at time T1, heat enable signal HEAT may be at a logic low level. With heat enable signal HEAT at a logic low level, logic gate circuit 1418 in control circuit 1410 may provide a heater drive enable signal HT_N having a logic high level (heater drive disable logic level). In this way, IGFET 1422 in driver circuit 1420 may be turned off and a high impedance path may be provided between power supply VDD and heater drive signal HTDRV.

At time T2, (a predetermined delay after time T1 to allow sensor circuit 236 to properly sense the resistance of thermal sensing element 228), heat enable signal HEAT may transition to a logic high level to enable logic gate circuit 1418. With temperature range lower limit detect signal TLO at a logic low level, logic gate circuit 1416 may provide a logic high at an output terminal. With logic gate circuit 1418 receiving a logic high level at first and second input terminals, heater drive enable signal HT_N may transition to a logic low level (heater drive enable logic level) and IGFET 1422 in driver circuit 1420 may be turned on to provide a low impedance path between power supply VDD and heater drive signal HTDRV. In this way, current may be provided to heater element 227 and power may be dissipated in the form of heat to heat up the multi-chip package (120 or 220).

The temperature TEMP of multi-chip package (120 or 220) may then increase. A short time before time T3, the temperature TEMP may cross the temperature range lower limit value Temp1. The resistance value of thermal sensing element 228 may change to a predetermined value and sensor circuit 236 provide a temperature range lower limit detect signal TLO that transitions from a low to a high logic level. Control circuit 1410 receives the high logic level of temperature range lower limit detect signal TLO. At this time, because first input terminal of logic gate circuit 1416 still receives a logic low level from the output of logic gate circuit 1414, the output of logic gate circuit 1416 remains logic high and heater enable signal HT_N remains at a logic low level. In this way, and IGFET 1422 in driver circuit 1420 may remain turned on to provide a low impedance path between power supply VDD and heater drive signal HTDRV. In this way, current may continue to be provided to heater element 227 and power may be dissipated in the form of heat to heat up the multi-chip package (120 or 220).

The multi-chip package (120 or 220) may continue to be heated by heater element 227 until the temperature TEMP reaches the temperature range upper limit value Temp2 at time T3. At this time, the resistance value of thermal sensing element 228 may change to a predetermined value and sensor circuit 236 provides a temperature range upper limit detect signal THI that transitions from a low to a high logic level. Control circuit 1410 receives the high logic level of temperature range upper limit detect signal THI. Because logic gate circuit 1414 can receive a logic low level at the first input terminal (by way of logic gate circuit 1412), logic gate circuit 1414 can provide a logic high output. Thus, with logic gate circuit 1416 receiving logic high levels at both first and second input terminals, logic gate circuit 1416 may provide a logic low level at an output. Because logic gate circuit 1418 receives a logic low level at a first input terminal, logic gate circuit 1418 may provide a logic high output as heater enable signal HT_N at an output terminal. IGFET 1422 may receive the logic high level and may be turned off. In this way, a high impedance path may be provided between power supply potential VDD and heater drive signal HTDRV and current may be prevented from flowing through heater element 227 and the temperature TEMP of multi-chip package (120 or 220) may begin to decrease.

Also, because the output of logic gate circuit 1416 is at a logic low level, the output of logic gate circuit 1414 is latched to a logic high level. In this way, the output of logic gate circuit 1416 may only transition in response to temperature range lower limit detect signal TLO transitioning back to a logic low level.

After multi-chip package (120 or 220) cools to a temperature TEMP below the temperature range upper limit value Temp2, sensor circuit 236 provide a temperature range upper limit detect signal THI that transitions from a high to a low logic level.

At time T4, multi-chip package (120 or 220) cools to a temperature TEMP below the temperature range lower limit value Temp1 and sensor circuit 236 provide a temperature range lower limit detect signal TLO that transitions from a high to a low logic level. In response to this transition, logic gate circuit 1416 provides a logic high output. With logic gate circuit 1418 receiving a logic high level at first and second input terminals, heater drive enable signal HT_N may transition back to a logic low level and IGFET 1422 in driver circuit 1420 may be turned on to provide a low impedance path between power supply VDD and heater drive signal HTDRV. In this way, current may be provided to heater element 227 and power may be dissipated in the form of heat to heat up the multi-chip package (120 or 220).

This cycle of preventing current flow to heater element 227 in response to a temperature TEMP reaching a temperature range upper limit value Temp2 and allowing current to flow once again to heater element 227 once the temperature TEMP reaches a temperature range lower limit value Temp1 can continue to keep the temperature TEMP of multi-chip package (120 or 220) confined to essentially a temperature range defined by temperature range upper limit value TEMP2 and temperature range lower limit value TEMP1.

Finally, after a predetermined heal time period T-heal at time T5, the defects caused by read/write cycles may be substantially healed and heal logic 232 may provide heat enable signal HEAT and sensor enable signal SEN that both transition to a logic low level to disable both sensor circuit 236 and heat control circuit (1400 and 234). In this way, current may be prevented from flowing through heater element 227 and thermal sensing element 228.

Also at time T5, temperature range lower limit detect signal TLO and temperature range upper limit detect signal THI may return to a logic low level.

It is noted that temperature range upper value Temp2 may be below a temperature Tcrit. Temperature Tcrit can be a temperature at which the temperature of multi-chip package (120 or 220) can suffer a catastrophic failure due to melting of components, such as solder connections (370, 670, 870, 1070, and 1270). Temperature Tcrit may be essentially the melting temperature of lead free solder balls or about 217° C. Temperature range upper value Temp2 may be in a range between 190° C. and 215° C. Temperature range lower value Temp1 may be in a range between 1° C. and 10° C. less than temperature range upper value Temp1.

Vias (380, 382, 384, 680, 682, 684, 880, 882, 884, 1080, 1082, 1084, 1280, 1282, and 1284) may be through silicon vias (TSV). The through silicon vias may be formed of conductive material and may include micro-bumps, such as solder connections, between devices such as adjacent stacked, non-volatile semiconductor memory devices and/or an adjacent stacked memory controller. In this way, a via (380, 382, 384, 680, 682, 684, 880, 882, 884, 1080, 1082, 1084, 1280, 1282, and 1284) may include a melting point that can be similar to a melting point of lead free solder balls.

Figure 16:
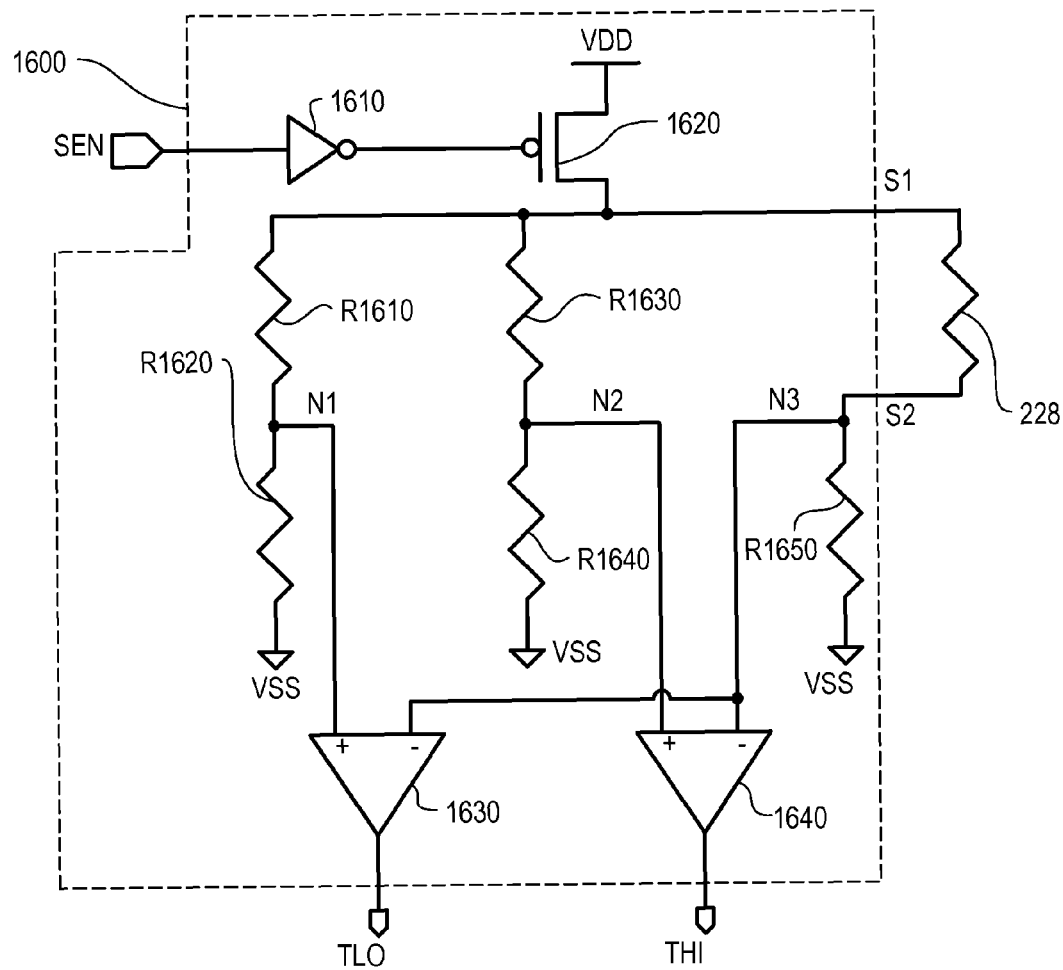
FIG. 16 is a circuit schematic diagram of a sensor circuit according to an embodiment.

Referring now to FIG. 16, a sensor circuit according to an embodiment is set forth in a circuit schematic diagram and given the general reference character 1600.

Sensor circuit 1600 can be used as sensor circuit 236 illustrated in FIG. 2.

Sensor circuit 1600 can receive sensor enable signal SEN and may provide temperature range lower limit detect signal TLO and temperature range upper limit detect signal THI based on a potential between first and second sense lines (S1 and S2), wherein the potential between first and second sense lines (S1 and S2) can be dependent upon the temperature of temperature sensing element 228.

Sensor circuit 1600 can include a logic gate circuit 1610, an insulated gate field effect transistor (IGFET) 1620, amplifier circuits (1630 and 1640), and resistors (R1610, R1620, R1630, R1640, and R1650). Logic gate circuit 1610 can receive sense enable signal SEN at an input terminal and may provide an output at an output terminal. Logic gate circuit 1610 can be an inverter logic gate. IGFET 1620 can have a gate terminal connected to receive the output of logic gate circuit 1610, a source terminal connected to receive a supply potential VDD, and a drain terminal commonly connected to sense line S1, a first terminal of resistor R1610, and a first terminal of resistor R1630. IGFET 1620 may be a p-channel IGFET. Resistor R1610 can have a second terminal commonly connected to a first terminal of resistor R1620 and a positive input terminal of amplifier circuit 1630 at node N1. Resistor R1620 can have a second terminal connected to a reference potential VSS. Resistor R1630 can have a second terminal commonly connected to a first terminal of resistor R1640 and a positive input terminal of amplifier circuit 1640 at node N2. Resistor R1640 can have a second terminal connected to a reference potential VSS. Amplifier circuits (1630 and 1640) can each have a respective negative input terminal connected to a first terminal of resistor R1650 at a node N3. Node N3 can be connected to sense line S2. Resistor R1650 can have a second terminal connected to reference potential VSS.

Temperature sensing element 228 can have first and second terminals connected between sense lines (S1 and S2).

Figure 17:
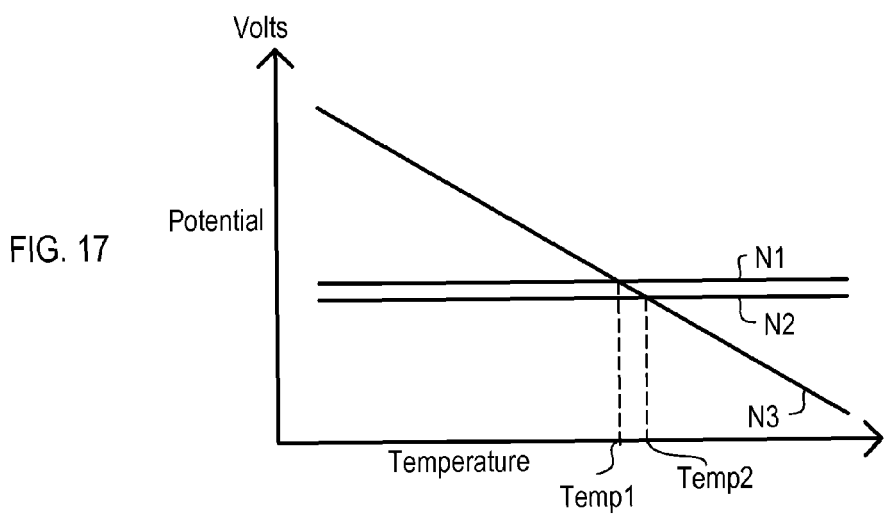
FIG. 17 is graph showing the potentials of various nodes of a sensor circuit according to an embodiment.

FIG. 17 is a graph showing the potentials of various nodes of sensor circuit 1600 versus temperature of thermal sensing element 228. The temperature of thermal sensing element 228 can essentially be a temperature of multi-chip package (120 or 220) at thermal sensing element 228.

FIG. 17 illustrates potentials at nodes (N1, N2, and N3) of sensor circuit 1600.

The operation of sensor circuit 1600 will now be discussed with reference to FIG. 16 in conjunction with FIG. 17.

When sense enable signal SEN is at a logic low level, logic gate circuit 1610 provides a logic high output. With the gate terminal of IGFET 1620 at a logic high level, IGFET 1620 may be turned off and provides a high impedance path between power supply potential VDD and sense line S1. In this way, current may be prevented from flowing through resistors (R1610, R1620, R1630, R1640, and R1650) as well as thermal sensing element 228.

When sense enable signal is at a logic high level, logic gate circuit 1610 provides a logic low output. With the gate terminal of IGFET 1620 at a logic low level, IGFET 1620 may be turned on and provides a low impedance path between power supply potential VDD and sense line S1.

In this way, current may flow between power supply potential VDD and reference potential VSS through three voltage divider circuits. The first voltage divider circuit can be formed by resistors (R1610 and R1620) to provide a potential at node N1. The potential at node N1 can be a reference potential. The second voltage divider circuit can be formed by resistors (R1630 and R1640) to provide a potential at node N2. The potential at node N2 can be a reference potential. The third voltage divider circuit can be formed by thermal sensing element 228 and resistor R1650 to provide a potential at node N3. The potential at node N3 can be a temperature dependent potential.

When the potential at node N1 is less than the potential at node N3, amplifier circuit 1630 provides a temperature range lower limit detect signal TLO having a logic low level. When the potential at node N1 is greater than the potential at node N3, amplifier circuit 1630 provides a temperature range lower limit detect signal TLO having a high low level. When the potential at node N2 is less than the potential at node N3, amplifier circuit 1640 provides a temperature range upper limit detect signal THI having a logic low level. When the potential at node N2 is greater than the potential at node N3, amplifier circuit 1640 provides a temperature range upper limit detect signal THI having a high low level.

As illustrated in FIG. 17, the potential at node N3 can change with respect to a change in the temperature of multi-chip package (120 and 220) in which thermal sensing element 228 resides. However, because resistors (R1610 to R1640) may be on a different semiconductor device (controller 110 or 210) outside of multi-chip package (120 and 220) and having a temperature that is relatively constant, the first and second voltage divider circuits provide consistent potentials at nodes (N1 and N2) respectively.

In this way, when multi-chip package (120 or 220) is at a temperature lower than temperature range lower limit value TEMP1, sensor circuit 1600 can provide a temperature range lower limit detect signal TLO having a logic low level and when multi-chip package (120 or 220) is at a temperature greater than temperature range lower limit value TEMP1, sensor circuit 1600 can provide a temperature range lower limit detect signal TLO having a logic high level. When multi-chip package (120 or 220) is at a temperature lower than temperature range upper limit value TEMP2, sensor circuit 1600 can provide a temperature range upper limit detect signal THI having a logic low level and when multi-chip package (120 or 220) is at a temperature greater than temperature range upper limit value TEMP2, sensor circuit 1600 can provide a temperature range upper limit detect signal THI having a logic high level.

Figure 18:
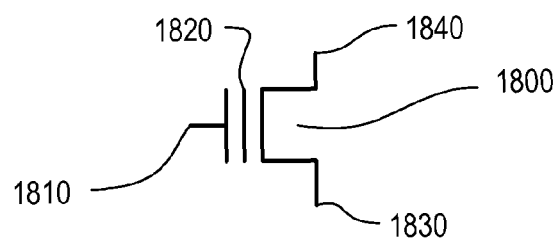
FIG. 18 is a circuit schematic diagram of non-volatile memory storage cell.

Referring now to FIG. 18, a non-volatile memory storage cell is set forth in a circuit schematic diagram and given the general reference character 1800. The non-volatile memory storage cell 1800 can be used in non-volatile semiconductor memory devices (330, 630, 830, 1030, and 1230). Non-volatile memory storage cell 1800 can include a control gate terminal 1810, a floating gate element 1820, a source terminal 1830, and a drain terminal 1840. Data may be stored on the floating gate element 1820 by way of electrical charge.

Other electrical apparatus other than semiconductor devices may benefit from the invention.

While various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A system, comprising:
   a package including
      at least a first semiconductor device; and
      at least a first heater element having a first terminal coupled to receive a heat drive current, the heater element generating heat with the heat drive current to heat the first semiconductor device;
      a plurality of solder connections formed on a bottom surface, and
      a first via configured to carry the heat drive current through the first semiconductor device; and a heat control circuit disposed outside of the package configured to provide the heat drive current in response to at least a heat enable signal; wherein
the first semiconductor device is disposed between the heater element and the solder connections.

2. The system of claim 1, wherein:
the heat control circuit includes heal logic configured to activate the heat enable signal in response to a determination that circuit elements in the first semiconductor device need healing.

3. The system of claim 2, wherein:
the first semiconductor device includes memory cells; and
the heal logic activates the heat enable signal in response defect data for or numbers of operations performed on the memory cells.

4. The system of claim 1, wherein:
the first heater element has a second terminal coupled to a reference potential.

5. The system of claim 1, wherein:
the first heater element is formed on a first substrate and stacked above the first semiconductor device in the package.

6. The system of claim 1, wherein:
the package includes a substrate disposed between the first semiconductor device and the plurality of solder connections, the substrate including a first interconnect configured to carry the heat drive current through the substrate.

7. The system of claim 1, wherein:
the package includes a second semiconductor device; and
the first semiconductor device is stacked on an upper surface of the second semiconductor device; and
the first heater element is stacked on an upper surface of the first semiconductor device.

8. The system of claim 1, wherein:
the package includes a second semiconductor device; and
the first heater element is sandwiched between the first and second semiconductor devices.

9. The system of claim 1, wherein:
the package includes a second semiconductor device; and
the first semiconductor device is stacked on an upper surface of the second semiconductor device; and
the first heater element is on a first side surface of the stacked first and second semiconductor devices.

10. The system of claim 9, wherein:
the package further includes a second heater element on a second side surface of the stacked first and second semiconductor devices, the first side surface and the second side surface are opposite surfaces.

11. The system of claim 1, wherein:
the first semiconductor device is a non-volatile semiconductor memory device.

12. The system of claim 1, wherein:
the heater element comprising a material selected from the group consisting of: polysilicon, platinum, and polyimide.

13. A system, comprising:
a package including
 at least a first semiconductor device; and
 at least one heater element having a first heater terminal coupled to receive a heat drive signal, the heater element provides heat to the first semiconductor device in response to the heat drive signal; and
a heat control circuit including
 a driver circuit configured to activate the heat drive signal in response to a heat enable signal,
 heal logic configured to activate the heat enable signal in response to a determination that circuit elements in the first semiconductor device need healing; and
the driver circuit disposed outside of the package configured to activate the heat drive signal in response to the heat enable signal by providing a low impedance path between a power supply potential and the first heater terminal in response to the heat enable signal having one value and providing a high impedance path between the power supply potential and the first heater terminal in response to the heat enable signal having another value.

14. The system of claim 13, wherein:
the driver circuit includes an insulated gate field effect transistor (IGFET) having a first terminal coupled to the power supply potential, a signal terminal coupled to provide the heat drive signal, and a control terminal coupled to receive a heat enable signal, the IGFET providing a low impedance path between the power supply potential and the signal terminal in response to the heat enable signal having one value and providing a high impedance path between the power supply potential and the signal terminal in response to the heat enable signal having a second value.

15. A system, comprising:
at least a first semiconductor device disposed in a package;
at least one heater element disposed in the package and configured to heat at least the first semiconductor device in response to an active heat drive signal;
a thermal sensing circuit configured to receive at least one temperature sense value for the package and to determine when a package temperature is between a lower limit and an upper limit; and
a heat control circuit disposed outside of the package that includes
 a driver circuit configured to activate the heat drive signal in response to a heat enable signal by providing a low impedance path between a power supply potential and the at least one heater element in response to an active heat enable signal and providing a high impedance path between the power supply potential and the first heater terminal in response to an inactive heat enable signal, and
 heal logic configured to activate the heat enable signal in response to a determination that circuit elements in the first semiconductor device need healing; wherein
activation of the heat drive signal is dependent upon the thermal sensing circuit determining the package temperature is between the lower limit and upper limit.

16. The system of claim 15, wherein:
the thermal sensing circuit is disposed outside of the package.

* * * * *